United States Patent [19]
Suzuki

[11] Patent Number: 5,994,709
[45] Date of Patent: Nov. 30, 1999

[54] CHARGED-PARTICLE-BEAM EXPOSURE APPARATUS EXHIBITING ABERRATION CONTROL

[75] Inventor: Shohei Suzuki, Tokyo, Japan

[73] Assignee: Nikon Corporation, Tokyo, Japan

[21] Appl. No.: 09/042,385

[22] Filed: Mar. 13, 1998

[30] Foreign Application Priority Data

Mar. 14, 1997 [JP] Japan ................................. 9-060880

[51] Int. Cl.⁶ .......................... H01J 37/302; H01J 37/153
[52] U.S. Cl. ............................... 250/492.23; 250/492.22; 250/398
[58] Field of Search ................... 250/492.23, 492.22, 250/492.2, 398

[56] References Cited

U.S. PATENT DOCUMENTS 5,283,440  2/1994  Sohda et al. ......................... 250/492.2

OTHER PUBLICATIONS

Heritage, "Electron–Projection Microfabrication System," *J. Vac. Sci. Technol.* 12:1135–1140 (1975).
Hosokawa, "Systematic Elimination of Third Order Aberrations in Electron Beam Scanning System," *Optic* 56:21–30 (1980).
Koikari et al., "Numerical Calculation of Optical System for EB Projection," MicroProcess '96—The 9th International Microprocess Conference, Jul. 8–11, 1996.
Zhu et al., "Dynamic Correction of Aberrations in Focusing and Deflection Systems with Shaped Beams," *SPIE* 2522:66–77 (1995).

*Primary Examiner*—Jack I. Berman
*Attorney, Agent, or Firm*—Klarquist Sparkman Campbell Leigh & Whinston, LLP

[57] ABSTRACT

Charged-particle-beam (CPB) exposure apparatus are disclosed that project a mask pattern onto a substrate while reducing aberrations. The mask pattern is typically subdivided into mask subfields, separated from each other by struts or the like, that are individually projected onto the substrate in an ordered manner to produce a die pattern in which constituent transfer subfields are properly stitched together. The apparatus comprises a projection-optical system, comprising multiple deflectors, between the mask and the substrate. The deflectors are connected to and controllably actuated by a controller in a manner serving to reduce third-order deflection aberrations to zero. Control of the deflectors is such that the charged-particle beam, propagating from the mask, has a trajectory that is a function of the location of the beam in a mask plane transverse to the optical axis and the location of the beam in a substrate plane transverse to the optical axis.

4 Claims, 2 Drawing Sheets

CHARGED-PARTICLE-BEAM EXPOSURE APPARATUS EXHIBITING ABERRATION CONTROL

FIELD OF THE INVENTION

The present invention relates to microlithography apparatus employing a charged-particle beam (e.g., electron beam) for exposure of a mask pattern onto a sensitive substrate, as used in manufacturing semiconductor devices.

BACKGROUND OF THE INVENTION

With the advent of microlithography methods and apparatus employing a charged-particle beam (CPB), a chronic difficulty has been achieving high exposure resolution and high throughput. Various approaches have been proposed to such end.

A first approach, tantalizingly offering prospects of high throughput, is an apparatus that exposes at least one entire die per exposure. One disadvantage of this approach is that it is difficult to manufacture a CPB-exposure mask from which an entire die can be projection-exposed in one shot. Another disadvantage is that it is exceedingly difficult to satisfactorily control aberrations over an entire die that is exposed in one shot. In fact, the goal of aberration control has been elusive with this first approach.

A second approach, offering prospects of improved resolution, utilizes "segmented exposure" in which a mask corresponding to an entire die is divided into multiple "subfields" that are individually exposed step-by-step. Thus, multiple shots are required to projection-expose a corresponding die on a sensitive substrate ("wafer"). Because the CPB is much smaller in transverse area using this second approach, the prospects for satisfactory aberration control (especially in peripheral regions of each shot) are more favorable.

An electron-optical theory applicable to certain types of segmented exposure is disclosed in Koikari et al., "Numerical Calculation On Optical System for EB Projection," Proceedings of the 9th International Microprocessing Conference("Microprocess '96"), Jul. 8–11, 1996. Koikari et al. pertains to an electron-beam (EB) optical system employing a symmetric magnetic doublet lens system comprising first and second static axisymmetric lenses. The Koikari et al. CPB optical system also comprises multiple magnetic deflectors that impart paraxial deflections to an electron beam propagating, from a point on the mask, through the EB optical system to the wafer. The deflections purportedly reduce certain (but not all) aberrations. Also, the Koikari et al. deflectors impart no net deflection of the electron beam at the wafer plane. I.e., when electrons in the electron beam reach the wafer plane, all deflections imparted by the deflectors during propagation of the electrons from the mask to the wafer are exactly cancelled.

Consequently, the Koikari et al. theory, as presented in the Koikari et al. paper, can be applied only to segmented exposure in which individual mask subfields are contiguous (i.e., not separated from each other by boundary regions occupied by struts or the like).

Deflectors according to Koikari et al. are typically energized by respective power supplies under the control of a "controller" (i.e., numerical processor or computer). Each signal sent by the controller to a respective power supply is a function of the X- and Y-coordinates ($X_m$, $Y_m$) of the illuminated mask subfield but does not take into account the X- and Y-coordinates ($X_w$, $Y_w$) of the corresponding transfer subfield on the wafer.

FIG. 3 is a plan view of a wafer 11 exposed using a conventional electron-beam exposure system exhibiting aberration correction in a manner such as disclosed in Koikari et al. The optical axis AX of the system extends perpendicularly to the plane of the page at the position indicated. FIG. 3 also shows the relationship between the position of illuminated mask subfields 100a, 100b (relative to the optical axis AX) and the positions of the corresponding transfer subfields 200a, 200b (relative to the optical axis AX).

A CPB exposure apparatus embodying the principles of Koikari et al. has "zero deflection sensitivity" with respect to the deflectors, by which is meant that the deflectors collectively impart no net deflection of the electron beam from a wafer position that would be illuminated if no aberration-correcting deflectors were provided (or if the aberration-correcting deflectors were not energized. Also, according to conventional wisdom, the central coordinates ($X_w$, $Y_w$) of a transfer subfield are related to the central coordinates ($X_m$, $Y_m$) of the corresponding mask subfield by the following equations (1) and (2):

$$X_w = -M(X_m \cos\theta - Y_m \sin\theta) \qquad (1)$$

$$Y_w = -M(X_m \sin\theta + Y_m \cos\theta) \qquad (2)$$

wherein M is the combined magnification (M>0) of the static axisymmetric projection lenses and $\theta$ is a rotational angle of the image of the mask subfield formed on the respective transfer subfield.

To increase the mechanical rigidity of a segmented mask and render the mask more resistant to thermal distortion during illumination of the mask by the charged-particle beam, it is preferable to provide the mask with struts. Typically, the struts are placed between mask subfields. When the mask subfields on such a mask are projected onto the wafer, the struts are not projected. In order to form a complete integral image of the die on the wafer, all the transfer subfields of the die must be properly "stitched together." Thus, even though the mask subfields are separated from one another on the mask by the struts, the corresponding transfer subfields of the complete die formed on the wafer must be "connected" together without any intervening gaps. The charged-particle beam used to make such an exposure must be deflected in a manner ensuring that strut regions are not projected and that the transfer subfields in each die are properly stitched together on the wafer.

In order to stitch the transfer subfields together on the wafer when using a segmented mask with struts, aberrations must be controlled very well to ensure accurate alignment of all the transfer subfields with each other. Such aberrational control includes control of "hybrid" image-plane distortions and blur. (A "hybrid" distortion at a given point in an image is a function of both the distance of the point from the optical axis and the distance of the point from the center of the subfield. See Zhu et al., "Dynamic Correction of Aberrations in Focusing and Deflection Systems with Shaped Beams," SPIE 2522:66–77.) Functions according to, e.g., Koikari et al. are simply inadequate for use with a segmented mask including struts. Koikari et al. does not address how to make appropriate changes to the functions. Also, changing functions and/or adding more deflectors, without more, can undesirably cause aberrations to increase.

Therefore, there is a need for charged-particle-beam exposure apparatus that: (1) utilize a segmented mask including struts separating the mask subfields, (2) stitch together the corresponding transfer subfields on the wafer, and (3) satisfactorily reduce third-order aberrations.

SUMMARY OF THE INVENTION

In view of the foregoing, an object of the present invention is to provide a charged-particle-beam (CPB) exposure apparatus that can perform projection exposure of mask subfields onto corresponding transfer subfields on the wafer such that the transfer subfields are properly stitched together without generating third-order deflection aberrations.

According to one aspect of the invention, a charged-particle-beam (CPB) exposure system is provided for transferring a mask pattern onto a sensitive substrate. The CPB exposure system comprises a CPB illumination system, a CPB projection-optical system, and a controller. The CPB illumination system is arranged along an optical axis of the system. The CPB illumination system receives a charged-particle beam propagating along the optical axis, and directs the charged-particle beam to positions laterally displaced from the optical axis so as to illuminate individual mask subfields in an ordered manner. The CPB projection-optical system is situated relative to the mask so as to direct the beam of charged particles passing through the mask to corresponding transfer subfields (which can be laterally displaced from the optical axis) on a sensitive substrate. The CPB projection-optical system comprises multiple deflectors, situated between the mask and the sensitive substrate, to deflect the charged-particle beam. The deflectors are connected to the controller that produces, for each deflector, a control signal for controllably actuating each deflector so as to reduce third-order deflection aberrations. Each control signal is a respective function of the X- and Y-coordinates of the charged-particle beam passing through the mask and the X- and Y-coordinates of the charged-particle beam impinging upon a corresponding location on the sensitive substrate.

The CPB projection-optical system preferably comprises, on the optical axis, first and second projection lenses, and a scattering aperture situated axially between the first and second projection lenses. In general, multiple deflectors are associated with the first projection lens, and multiple deflectors are associated with the second projection lens.

The charged-particle beam can be an electron beam comprising electrons that are accelerated in a beam-accelerating voltage. The trajectory $w_c(z)$ of the electrons propagating from the mask is preferably according to the following:

$$w_c(z) = -ikw_a(z)\int_{z0}^{z} D(z)\overline{w_b}(z)dz + ikw_b(z)\int_{z0}^{z} D(z)\overline{w_a}(z)dz + I_1(w_b(z) + s_0 \cdot w_a(z)) \quad (3)$$

wherein $D(z)$ is the axial deflecting field, $i=(-1)^{1/2}$, $w_a(z)$ denotes the trajectory of an electron (in a lens field) starting from the mask at the optical axis and at unitary slope, $w_b(z)$ denotes the trajectory of an electron (in a lens field) starting from a point at a unitary distance from the optical axis and at zero slope, m is the rest mass of the electron, -e is the electron charge, V is the beam-acceleration voltage, the "−" cap denotes a complex conjugate, $z_0$ is the z coordinate of the mask plane, $s_0$ is a complex number corresponding to the angle relative to the mask plane at which the electron beam passes through the mask, $I_1$ has the relationship with the position $(X_m, Y_m)$ on the mask illuminated by the electron beam:

$$I_1 = C_1(X_m + iY_m)$$

wherein $C_1$ is a constant, and k is an amount expressed by $$k = \sqrt{c/2mV(1+\epsilon V)} \quad (4)$$

wherein $\epsilon = e/2mc^2$, and c is the velocity of light.

The foregoing and additional features and advantages of the present invention will be more readily apparent from the following detailed description, which proceeds with reference to the accompanying drawings.

DETAILED DESCRIPTION

Figure 1:
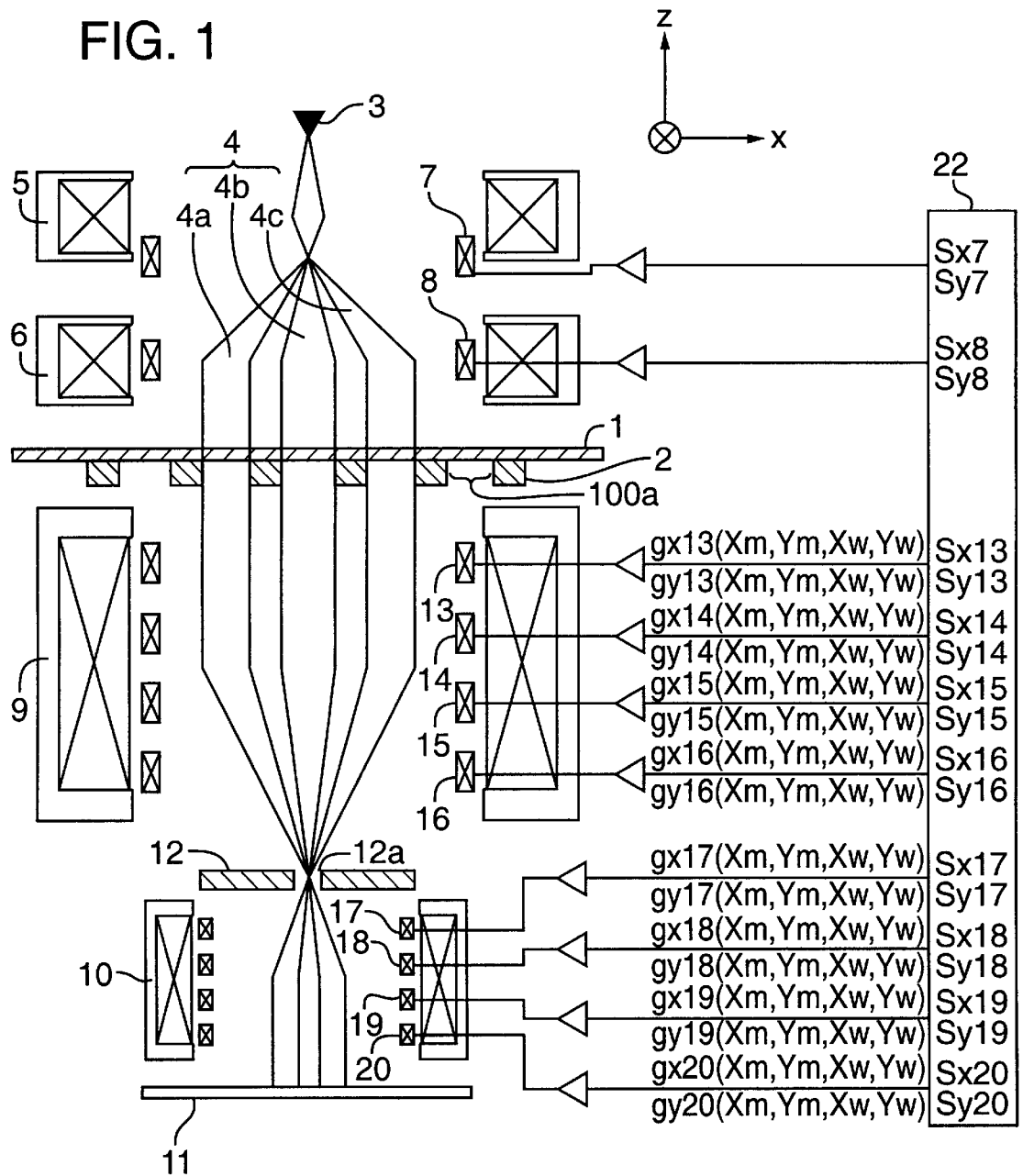
FIG. 1 is a schematic elevational diagram of a preferred embodiment of a charged-particle-beam exposure apparatus according to the present invention.

A preferred embodiment of a charged-particle-beam (CPB) exposure apparatus according to the present invention is depicted in FIG. 1.

The apparatus of FIG. 1 utilizes a mask 1 in which the die pattern is divided into multiple subfields 100a separated from one another by struts 2 that collectively form a supporting lattice. A CPB 4 produced by a source (e.g., electron gun) 3 propagates through condenser lenses 5, 6 and past deflectors 7, 8 to impinge on a desired mask subfield 100a. An image of the mask subfield 100a is projected by the CPB 4 onto a respective transfer subfield on the sensitive substrate ("wafer") 11. The mask subfields 100a are illuminated in a predetermined order. FIG. 1 shows three representative CPBs 4a, 4b, 4c to indicate possible deflections imparted to the CPB by the deflectors 7, 8.

The electron beam 4, after passing through a mask subfield 100a, is converged by first and second projection lenses 9, 10, respectively, for projection onto a corresponding transfer subfield on the wafer 11. During propagation of the beam from the first projection lens 9 to the second projection lens 10, the beam passes through a "scattering aperture" 12a defined by a stop 12 made of a material that blocks scattered electrons.

For achieving the stated object of the invention and for achieving other advantages, the FIG. 1 apparatus comprises multiple deflectors 13–20 situated between the mask 1 and the wafer 11 to deflect the CPB 4 as required. The deflectors 13–16 are positioned near (and thus "associated with") the first projection lens 9, and the deflectors 17–20 are positioned near (and thus "associated with") the second projection lens 10.

Each deflector 13–20 is connected to a controller 22. The controller 22 generates electrical signals Sx13, Sy13, . . . , Sx20, Sy20 selectively routed to the respective deflectors 13–20 via respective power supplies (each power supply is indicated in the drawing by a respective amplifier symbol to the right of each deflector). The power supplies, responsive to the respective electrical signals from the controller, apply a proper energization to the respective deflectors. The respective electrical signals are formulated to controllably actuate the respective deflectors so as to eliminate third-order aberrations, based on the position of each transfer subfield on the wafer 11 and on the position of the corresponding mask subfield 100a on the mask 1.

The signals from the controller 22 that control actuation of the deflectors 13–20 embody an application of a theory, for correcting deflection aberrations, set forth by Hosokawa, *Optik* 56:21–31 (1980), incorporated herein by reference. The Hosokawa theory is directed to reducing third-order aberrations to zero when an electron beam, passing through a mask but at a fixed location in space (typically at the optical axis), is deflected away from the location to illuminate an arbitrary location on a specimen (e.g., a sensitive substrate).

In the Hosokawa theory, the following equation (3) is used to express an electron trajectory $w_c(z)$ from the fixed location whenever both a deflection field and a lens field are present. The electron trajectory $w_c(z)$ starts from the object (mask) plane with zero slope at the axis:

$$w_c(z) = -ikw_a(z)\int_{z0}^{z} D(z)\overline{w_b}(z)dz + ikw_b(z)\int_{z0}^{z} D(z)\overline{w_a}(z)dz \quad (3)$$

wherein $D(z)$ is the axial deflecting field, $i=(-1)^{1/2}$, $w_a(z)$ denotes the trajectory of an electron (in a lens field) starting from the object plane at the axis and at unitary slope, $w_b(z)$ denotes the trajectory of an electron (in a lens field) that starts from a point at a unitary distance from the axis and at zero slope, m is the rest mass of the electron, –e is the electron charge, V is the beam acceleration voltage, the "–" cap denotes a complex conjugate of the subject function, $z_0$ is the z coordinate of the object plane, and k is an amount expressed by the following equation (4).

$$k = \sqrt{c/2mV(1+\epsilon V)} \quad (4)$$

wherein $\epsilon=e/2mc^2$, and c is the velocity of light.

The present invention encompasses an extension of the Hosakawa theory to include instances in which the location at which the electron beam passes through the mask is variable, not fixed (such as required when illuminating a segmented mask in which the mask subfields are separated by struts). According to the present invention, the trajectory $w_c(z)$ is expressed by adding the following to the right side of Equation (3):

$$I_1(w_b(z)+s_0 \cdot w_a(z)) \quad (5)$$

wherein $s_0$ is a complex number corresponding to an angle (relative to the optical axis) at which an electron beam passes through the mask. $I_1$ has the following relationship (Equation (6)) with the illumination position $(X_m, Y_m)$ on the mask:

$$I_1=C_1(X_m+iY_m) \quad (6)$$

wherein $C_1$ is an arbitrary complex constant.

A preferred embodiment of a charged-particle-beam exposure apparatus according to the present invention is shown in FIG. 1. The FIG. 1 apparatus is especially adapted for use with an electron beam, and includes a controller 22 that generates and applies a respective control signal to the deflectors 7, 8, and 13–20.

I.e., the trajectory $w_c(z)$ includes an additional term (Equation (5)). Thus, the value of an aberration, calculated on the basis of the trajectory $w_c(z)$, depends on the position of the illuminated region (e.g., subfield) on the mask as well as on the wafer. As a result, the control signals (Sx7, Sy7), (Sx8, Sy8), (Sx13, Sy13), . . . , (Sx20, Sy20) routed by the controller 22 to the power supplies of the respective aberration-correction deflectors 13–20 are expressed as Sx13=gx13 $(X_m, Y_m, X_w, Y_w)$, Sy13=gy13 $(X_m, Y_m, X_w, Y_w)$, . . . , Sx20=gx20 $(X_m, Y_m, X_w, Y_w)$, Sy20=gy20$(X_m, Y_m, X_w, Y_w)$ by using mutually independent functions gx13, gy13, gx14, gy14, . . . , gx20, gy0, wherein $(X_m, Y_m)$ denotes the location on the mask illuminated by the electron beam and $(X_w, Y_w)$ denotes the corresponding location on the wafer 11 exposed by the electron beam.

Figure 2A:
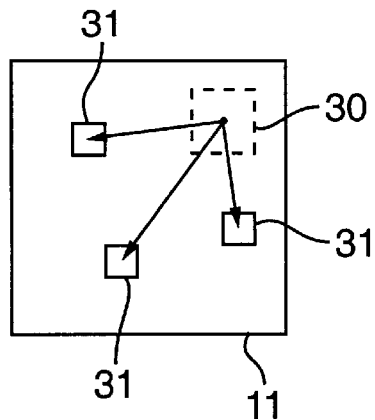
FIG. 2(a) is a plan view of a region of the wafer showing the relationship of the position of a mask subfield relative to possible positions of a corresponding transfer subfield.
Figure 2B:
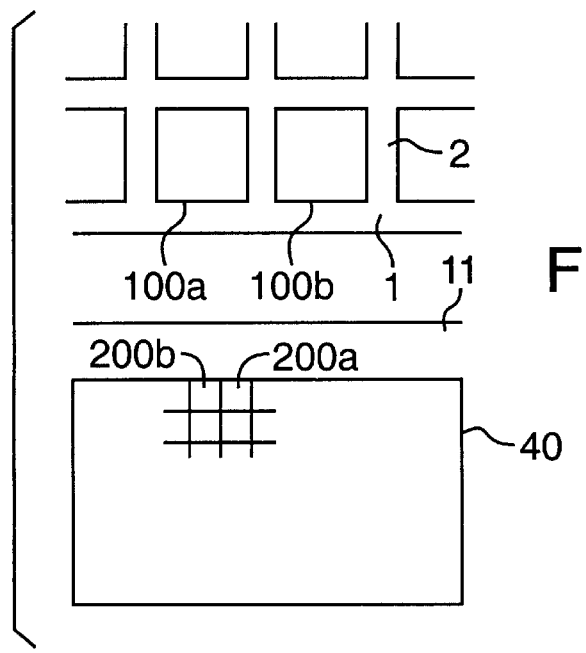
FIG. 2(b) is a plan view showing a representative arrangement of mask subfields on the mask and a corresponding representative arrangement of transfer subfields on the wafer.
Figure 3:
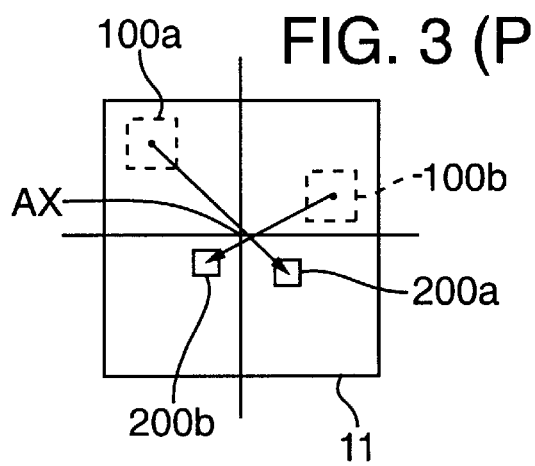
FIG. 3 is a plan view showing the relationship between mask subfields and corresponding transfer subfields using a conventional CPB exposure apparatus.

The controller 22 controls the deflectors 13–20 according to the illuminated location $(X_m, Y_m)$ on the mask 1 and the illuminated location $(X_w, Y_w)$ on the wafer 11. As a result, it is possible (as shown in FIG. 2(a)) to select a projection-exposure location 31 arbitrarily on the wafer 11 for each beam-illumination position 30 $(X_m, Y_m)$ on the mask. Even if the mask subfields 100a and 100b are isolated from each other by struts 2 on the mask 1 as shown in FIG. 2(b), the corresponding transfer subfields 200a and 200b on the wafer 11 (which contain the patterns in the respective mask subfields 100a and 100b) can be projected as interconnected with each other, with the third-order deflection aberration being satisfactorily reduced at the same time. The reference numeral 40 designates a die-sized region on the wafer 11.

If a mask-subfield pattern must be repeated many times in a die (as is the case when the die pattern is that of a memory chip) the mask-subfield pattern can be illuminated and projected multiple times per die, each time to a different transfer subfield on the wafer. Since the same mask subfield pattern need not be present in multiple copies on the mask, the area of the mask can be reduced.

Although the FIG. 1 embodiment has been described in connection with a electron-beam exposure apparatus, it will be readily understood that the principles can be applied to any of various charged-particle-beam exposure apparatus. In addition, the invention can be applied not only to apparatus for use with a segmented mask, but also to cell-projection-type exposure apparatus. Furthermore, the deflectors 13–20 can be magnetic type, electrostatic type, or hybrid type.

To correct deflection astigmatism or field curvature, a "dynamic stigmator" and/or a "dynamic-focus coil" can be added (see, e.g., Zhu et al., cited above). However, in the case of such an optical system as used with a segmented mask and having a large shot region of several hundreds of micrometers square, a dynamic stigmator and/or dynamic-focus coil may generate hybrid distortion proportional to the square of a position $(X_w, Y_w)$ on the wafer when correcting a deflection astigmatism or field curvature aberration. To correct such aberrations, multiple dynamic stigmators and/or dynamic-focus coils can be used, which are also effective in correcting hybrid aberrations.

The number of aberration-correcting deflectors that are employed depends upon, inter alia, the number and types of aberrations to be eliminated and other restrictive conditions. For example, seven deflectors can be used to address seven conditions, including (1) four aberration-control conditions: (a) minimizing deflection chromatic aberration, (b) minimizing deflection coma aberration, (c) minimizing a hybrid image-plane distortion, and (d) minimizing a hybrid deflection astigmatism; (2) the condition of passing the electron beam through the center of the scattering aperture; (3) the condition of causing the electron beam to be incident on the wafer at a zero angle of incidence; and (4) the condition of reducing deflection sensitivity to zero. If it were necessary to impose an additional control condition (e.g., elimination of deflection astigmatism), one or more additional deflectors can be used.

Thus, the present invention is directed to controlling various deflectors in a CPB exposure system. The deflectors are controlled according to the location on the mask illuminated by the beam and the location on the wafer illuminated by the beam. Such control provides superior, relative to conventional apparatus, reduction of third-order deflection aberrations. Consequently, an apparatus according to the invention allows arbitrary selection of an illuminated subfield on the mask. Even if various mask subfields are separated widely from one another on the mask, the respective pattern images corresponding to the mask subfields can be projected as interconnected transfer subfields on the wafer, without exhibiting third-order deflection aberrations.

Whereas the invention has been described in connection with a preferred embodiment, it will be apparent that the invention is not limited to that embodiment. On the contrary, the invention is intended to encompass all modifications, alternatives, and equivalents as may be included within the spirit and scope of the invention as defined by the appended claims.

What is claimed is:

1. A charged-particle-beam exposure system for transferring a mask pattern, divided into multiple mask subfields, onto a sensitive substrate, the system comprising:

(a) a charged-particle-beam illumination system arranged along an optical axis, the illumination system receiving a charged-particle beam propagating along the optical axis and directing the charged-particle beam to positions laterally displaced from the optical axis so as to illuminate individual mask subfields in an ordered manner;

(b) a charged-particle-beam projection-optical system situated relative to the mask so as to direct the beam of charged particles passing through the mask to corresponding transfer subfields, laterally displaced from the optical axis, on a sensitive substrate;

(c) the projection-optical system comprising multiple deflectors, situated between the mask and the sensitive substrate, to deflect the charged-particle beam; and (d) a controller connected to each deflector, the controller producing, for each deflector, a control signal for controllably actuating each deflector so as to reduce third-order deflection aberrations to zero, each control signal being a respective function of X- and Y-coordinates of the charged-particle beam passing through the mask and the X- and Y-coordinates of the charged-particle beam impinging upon a corresponding location on the sensitive substrate.

2. The system of claim 1, wherein the projection-optical system comprises, on the optical axis:

a first projection lens and a second projection lens; and a scattering aperture situated axially between the first and second projection lenses.

3. The system of claim 1, wherein the charged-particle beam is an electron beam comprising electrons propagating in a beam-accelerating voltage.

4. The system of claim 3, wherein electrons in the electron beam propagating from the mask have a trajectory $w_c(z)$ according to the following:

$$w_c(z) = -ikw_a(z)\int_{z_0}^{z} D(z)\overline{w_b}(z)dz + ikw_b(z)\int_{z_0}^{z} D(z)\overline{w_a}(z)dz + I_1(w_b(z) + s_0 \cdot w_a(z)) \tag{3}$$

wherein $D(z)$ is an axial deflecting field, $i=(-1)^{1/2}$, $w_a(z)$ denotes the trajectory of an electron (in a lens field) starting from a location on the mask at the optical axis and at unitary slope, $w_b(z)$ denotes the trajectory of an electron (in a lens field) starting from a point at a unitary distance from the optical axis and at zero slope, m is the rest mass of the electron, $-e$ is the electron charge, V is the beam-acceleration voltage, the "–" cap denotes a complex conjugate, $z_0$ is the z coordinate of the mask plane, $s_0$ is a complex number corresponding to an angle at which the electron beam illuminated onto the mask and passing through the mask is emitted, $I_1$ has the following relationship with a position $(X_m, Y_m)$ on the mask illuminated by the electron beam:

$$I_1 = C_1(X_m + iY_m)$$

wherein $C_1$ is a complex constant, k is an amount expressed by $$k = \sqrt{c/2mV(1+\epsilon V)}$$

wherein $\epsilon = e/2mc^2$, and c is the velocity of light.

* * * * *

UNITED STATES PATENT AND TRADEMARK OFFICE
CERTIFICATE OF CORRECTION

PATENT NO. : 5,994,709

DATED : November 30, 1999

INVENTOR(S) : Shohei Suzuki

It is certified that error appears in the above-identified patent and that said Letters Patent is hereby corrected as shown below:

Column 6, line 14, "gy0" should be --gy20--.

Signed and Sealed this

Twenty-second Day of May, 2001

Attest:

NICHOLAS P. GODICI

*Attesting Officer*     *Acting Director of the United States Patent and Trademark Office*